(12) United States Patent
Kamiya et al.

(10) Patent No.: US 11,165,388 B2
(45) Date of Patent: Nov. 2, 2021

(54) THERMOSTATIC OVEN TYPE ELECTRONIC INSTRUMENT

(71) Applicant: Interchip Co., Ltd., Shiroi (JP)

(72) Inventors: Masaaki Kamiya, Shiroi (JP); Ryuji Ariyoshi, Shiroi (JP)

(73) Assignee: Interchip Co., Ltd., Shiroi (JP)

( * ) Notice: Subject to any disclaimer, the term of this patent is extended or adjusted under 35 U.S.C. 154(b) by 379 days.

(21) Appl. No.: 16/301,902

(22) PCT Filed: May 16, 2017

(86) PCT No.: PCT/JP2017/018372
§ 371 (c)(1),
(2) Date: Nov. 15, 2018

(87) PCT Pub. No.: WO2017/199956
PCT Pub. Date: Nov. 23, 2017

(65) Prior Publication Data
US 2019/0222173 A1 Jul. 18, 2019

(30) Foreign Application Priority Data

May 17, 2016 (JP) .............................. JP2016-098615

(51) Int. Cl.
*H03B 5/04* (2006.01)
*H03B 5/32* (2006.01)
(Continued)

(52) U.S. Cl.
CPC ........... *H03B 5/04* (2013.01); *G05D 23/1919* (2013.01); *H03B 5/32* (2013.01); *H03B 5/364* (2013.01);
(Continued)

(58) Field of Classification Search
CPC ........................................................ H03B 5/04
(Continued)

(56) References Cited

U.S. PATENT DOCUMENTS 7,573,345 B2    8/2009  Hardy et al.
2001/0040154 A1*  11/2001  Hashimoto  .............. H03B 5/04
                                                                    219/210
(Continued)

FOREIGN PATENT DOCUMENTS

JP         2005165630 A      6/2005
JP         2007251366 A      9/2007
(Continued)

*Primary Examiner* — Joseph Chang
(74) *Attorney, Agent, or Firm* — The Webb Law Firm (57) ABSTRACT

To provide an oven controlled crystal oscillator which can keep constant the temperature of a quartz resonator housed within a thermostatic oven, thereby ensuring stable operation of the quartz resonator. An oven controlled crystal oscillator has a control system for exercising control so that the temperature of a quartz resonator becomes a target temperature Ttarg of a predetermined fixed value. The quartz resonator is housed within a thermostatic oven which is configured to compare a set temperature Tr and a measured temperature Tic based on an outside air temperature measured by a temperature sensor and which is controlled so that a difference between both temperatures is narrowed. The quartz resonator has characteristics influenced by an environmental temperature. The control system adds a predetermined feedback amount δT to the target temperature Ttarg of the fixed value to generate a new set temperature Tr for comparison with the measured temperature Tic so that when the measured temperature Tic lowers, the set temperature Tr becomes high, or when the measured temperature Tic rises, the set temperature Tr becomes low.

8 Claims, 6 Drawing Sheets

(51) Int. Cl.
*H03B 5/36* (2006.01)
*G05D 23/19* (2006.01)
*H03H 9/19* (2006.01)
*H03H 9/02* (2006.01)
*H03K 5/24* (2006.01)

(52) U.S. Cl.
CPC ........... *H03H 9/19* (2013.01); *H03H 9/02102* (2013.01); *H03K 5/24* (2013.01)

(58) Field of Classification Search
USPC ............................................ 331/69; 310/315
See application file for complete search history.

(56) References Cited

U.S. PATENT DOCUMENTS

| | | |
|---|---|---|
| 2003/0197567 A1 | 10/2003 | Villella et al. |
| 2007/0229176 A1 | 10/2007 | Fukuda |
| 2012/0306582 A1* | 12/2012 | Ito .............................. H03L 1/04 331/69 |
| 2014/0297056 A1 | 10/2014 | Akaike et al. |
| 2014/0368283 A1* | 12/2014 | Shimodaira ........ H03H 9/02102 331/70 |
| 2015/0084705 A1 | 3/2015 | Arai |

FOREIGN PATENT DOCUMENTS

| | | |
|---|---|---|
| JP | 2010213102 A | 9/2010 |
| JP | 2014191808 A | 10/2014 |
| JP | 201570301 A | 4/2015 |

* cited by examiner

THERMOSTATIC OVEN TYPE ELECTRONIC INSTRUMENT

This application is the United States national phase of International Application No. PCT/JP2017/018372 filed May 16, 2017, and claims priority to Japanese Patent Application No. 2016-098615 filed May 17, 2016, the disclosures of which are hereby incorporated in their entirety by reference.

BACKGROUND OF THE INVENTION

Technical Field

This invention relates to a thermostatic oven type electronic instrument, and is useful when applied to an oven controlled crystal oscillator.

Description of Related Art

A quartz resonator applied to a crystal oscillator has the property of varying greatly in oscillation frequency characteristics in response to a temperature. Various technologies have been proposed in order to compensate for such variations to ensure highly accurate stable frequency characteristics. A conventionally known oven controlled crystal oscillator (will hereinafter be referred to as OCXO) is one of such technologies (see, for example, Patent Document 1).

This type of OCXO is configured to compare an actual temperature, which is related to an outside air temperature measured with a temperature sensor, with a set temperature, and control a heat source so that a difference between both temperatures is narrowed, thereby keeping the temperature of a quartz resonator housed in a thermostatic oven as a casing at a predetermined target temperature. In detail, the OCXO is usually constituted by integrating the temperature sensor; a temperature setting unit where the predetermined target temperature has been set; a comparator; or a control means such as a transistor; a heater as the heat source; and so on with an oscillation circuit for driving the quartz resonator for modularization, and housing the resulting module within the thermostatic oven together with the quartz resonator.

In such an OCXO, the distance between the temperature sensor for detecting mainly the temperature within the module and the quartz resonator is long. Thus, even when the temperature within the module is controlled to the predetermined set temperature, the target temperature of the quartz resonator, by the heater or the like based on the temperature detected by the temperature sensor, a discrepancy is caused between the set temperature and the temperature of the quartz resonator defining the oscillation frequency. This is because the temperature of the quartz resonator is governed by various factors such as leakage of heat from the thermostatic oven.

With the OCXO according to the conventional technology, as mentioned above, leakage of heat from the thermostatic oven occurs inevitably, thus posing difficulty in continuing to hold the quartz resonator at the constant temperature. Variations in the oscillation frequency arise for this reason.

With the OCXO according to Patent Document 1, therefore, a temperature signal outputted by the temperature sensor which detects the temperature within the module is taken into an arithmetic processing unit to control the amount of heat generation by the heater. Utilizing a correction function for each OCXO which has been obtained beforehand, the arithmetic processing unit performs a predetermined computation based on the internal temperature signal to obtain a correction signal representing the amount of correction of the oscillation frequency. Based on this correction signal, the control voltage of a voltage controlled crystal oscillator (VCXO), for example, is controlled to correct the oscillation frequency. That is, the OCXO disclosed in Patent Document 1 adopts an OCXO as a basic structure, and has the concept of temperature compensation (TC) applied thereto, and is thereby designed to be capable of obtaining a highly accurate oscillation frequency stable in a wide temperature range even if the ambient temperature varies. Patent Documents 2 and 3 are existent as other documents on conventional technologies which, by adopting an OCXO as a basic structure, and having the concept of temperature compensation (TC) applied thereto, are designed to be capable of obtaining a highly accurate oscillation frequency stable in a wide temperature range even if the ambient temperature varies.

PRIOR ART DOCUMENTS

Patent Documents

Patent Document 1: U.S. Pat. No. 7,573,345
Patent Document 2: U.S. Patent Publication No. 2003/0197567
Patent Document 3: JP-A-2010-213102

SUMMARY OF THE INVENTION

Problems to be Solved by the Invention

The OCXOs described in Patent Documents 1 to 3 apply the concept of temperature compensation (TC) on the premise that temperature changes of the quartz resonators provided in them cannot be rendered constant. That is, they contrive to be capable of obtaining a high accuracy oscillation frequency stable in a wide temperature range even if the ambient temperature changes, by combining the concept of TC with the OCXO. This contrivance, however, arouses the new problem of a complicated configuration for compensation.

With the OCXO disclosed in Patent Document 1, for example, the temperature characteristics of the oscillation frequency of the quartz resonator are nonlinear. Partly because of this and for the purpose of preparing a correction function for temperature compensation, it is necessary to detect the oscillation frequency for each OCXO at each of a plurality of measuring points for measurement of the ambient temperature. Thus, this preparation of the correction function is burdensome.

Such problems are present similarly in Patent Documents 2 and 3 which perform TC on the premise that it is impossible to render temperature changes of the quartz resonators constant. The reason behind this is the necessity of generating a correction function for performing the temperature compensation of the oscillation frequency of the quartz resonator whose temperature characteristics are nonlinear.

The present invention has been accomplished in light of the foregoing problems with the conventional technologies. It is an object of the invention to provide a thermostatic oven type electronic instrument which, even if heat leakage from a thermostatic oven to outside air occurs, can keep constant the temperature of a device greatly varying in characteristics in response to a temperature, such as a quartz resonator accommodated in the thermostatic oven, thereby ensuring the stable operation of the device.

The present invention is based on novel findings obtained by analyzing the relation between the flow of thermal energy and the temperature of each part in conventional OCXOs. First, the results of the analysis and the novel findings based thereon will be described. Symbols used in the following explanations are defined as follows:

Definitions of Symbols

Terms and Corresponding Symbols

Set temperature: Tr
Temperature of heat source (heater): Tht
Measured temperature by temperature sensor (circuit temperature within IC based on outside air temperature): Tic
Temperature of quartz resonator within thermostatic oven: Tx
Outside temperature of thermostatic oven (outside air temperature): Tout
Target temperature of quartz resonator (target): Ttarg
Circuit gain: B
Amount of heat generated by heat source (power consumption): P
Thermal resistance between heat source and outside of thermostatic oven: θho
Thermal resistance between heat source and temperature sensor: θhc
Thermal resistance between heat source and quartz resonator: θhx
Thermal resistance between temperature sensor and outside of thermostatic oven: θco
Thermal resistance between quartz resonator and outside of thermostatic oven: θxo
Module coefficient (constant) determined by thermal resistance between respective components during component mounting: M(Mht, Mic, Mx)

<Flow of Thermal Energy in OCXO>

Figure 3:
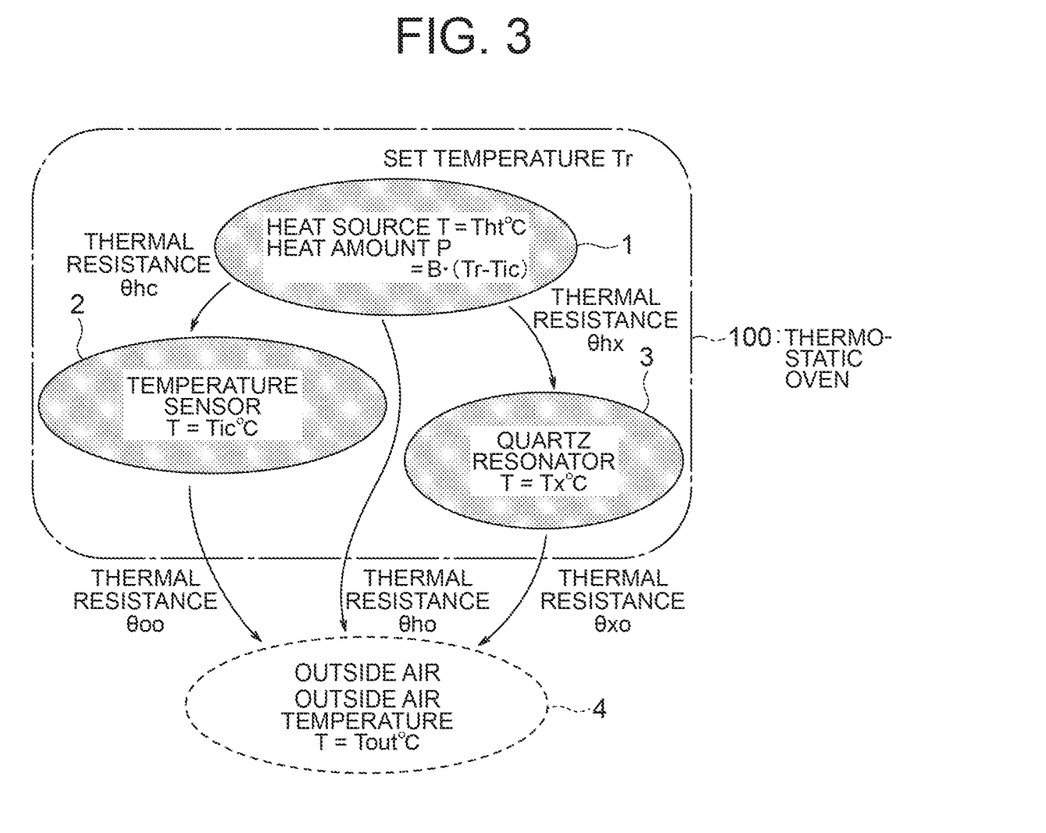
FIG. 3 is a schematic view illustrating the relation between the flow of thermal energy and the temperature of each part in an OCXO.

FIG. 3 is a schematic view illustrating the relations between the flow of thermal energy and the temperature of each component in OCXO. As shown in this drawing, heat generated in a heat source 1 composed of a heater usually leaks to a temperature sensor 2 based on thermal resistance θhc, to a quartz resonator 3 based on thermal resistance θhx, and further to outside air outward of a thermostatic oven 100 via thermal resistance θho to heat each of these parts. Simultaneously, the outside air 4 is heated with heat leaking from the temperature sensor 2 based on the thermal resistance θco, and heat leaking from the quartz resonator 3 based on thermal resistance θxo.

<Thermal Relation when Outside Air Temperature is Constant>

First of all, an investigation will be conducted into the relation between the temperatures of the respective parts when the outside air temperature becomes constant.

On this occasion, the amount of heat generated by the heat source 1 (temperature Tht) and the total amount of heat leaking from the heat source 1 to the outside air 4 are in balance. Thus, a relation of the following equation holds:

$$P=(Tht-Tout)/\theta ho$$

This equation is solved for Tht to obtain the following equation:

$$Tht=P\cdot\theta ho+Tout \quad (1)$$

If, in connection with the thermal resistance θho, the constant concerned with the heat source 1 is defined as a module coefficient Mht, the equation (1) is expressed as the following equation (2):

$$Tht=P\cdot Mht+Tout \quad (2)$$

In this case, a state of equilibrium with the outside air temperature Tout being constant is reached. Thus, the outside air temperature Tout is a constant, and the amount of heat generated, P, is also a constant. That is, the temperature Tht of the heat source (heater) 1 represents a linear function of the module coefficient M, with the amount of heat, P, which is the constant, as the slope, and the outside air temperature Tout, which is the constant, as the y-axis intercept (M=Mht).

Then, the amount of heat which the circuit receives from the heat source 1, namely, the amount of heat received by the temperature sensor 2, and the amount of heat flowing out of the temperature sensor 2 to the outside air 4 are balanced. Thus, a relation of the following equation holds:

$$(Tht-Tic)/\theta hc=(Tic-Tout)/\theta co$$

The temperature Tht of the heat source 1 in the equation (1) is substituted to solve for the measured temperature Tic, whereupon the following equation is obtained:

$$Tic=Tout+P\cdot\theta ho\cdot\theta co/(\theta hc+\theta co)$$

Here, the module coefficient Mic is defined as θho·θco/(θhc+θco) to obtain the following equation:

$$Tic=P\cdot Mic+Tout \quad (3)$$

The equation (3) shows that the measured temperature Tic, as in the equation (2), is a linear function of the module coefficient M (=Mic), with the amount of heat, P, which is the constant, as the slope, and the outside air temperature Tout, which is the constant, as the y-axis intercept.

The temperature Tx at the site of the quartz resonator 3 can, in exactly the same manner, be represented by the following equation:

$$Tx=Tout+P\cdot\theta ho\cdot\theta xo/(\theta hx+\theta xo)$$

If Mx is defined as θho·θxo/(θhx+θxo), the temperature Tx of the quartz resonator 3 is represented by the following equation (4):

$$Tx=P\cdot Mx+Tout \quad (4)$$

According to this equation (4), the temperature Tx of the quartz resonator 3 is also a linear function of the module coefficient M (=Mx), with the amount of heat, P, which is the constant, as the slope, and the outside air temperature Tout, which is the constant, as the y-axis intercept.

Figure 4:
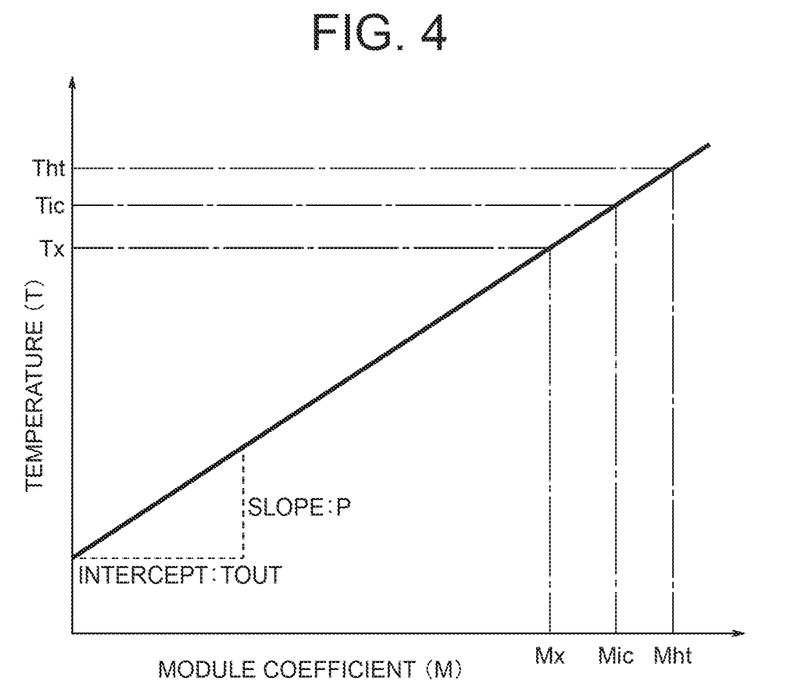
FIG. 4 is a characteristic diagram showing the relation between the module coefficient M and the temperature T.

The relations between the module coefficient M and the temperatures Tht, Tic, Tx, as stated above, are shown in FIG. 4. The magnitude relation of the module coefficient M in FIG. 4 is depicted as Mx<Mic<Mht, but this magnitude relation changes, for example, depending on the layout of the components of the OCXO. Basically, however, there is no doubt that all the temperature parameters are expressed as linear functions.

<Relation to Temperature when Outside Air Temperature Varies>

Next, an investigation will be conducted into the general circuit actions of the OCXO when the outside air temperature Tout varies. The OCXO is configured to detect the temperature difference between the set temperature Tr and the measured temperature Tic detected by the temperature sensor 2, and supply the heat source (heater) 1 with such an electric current as to decrease this temperature difference, thereby holding the temperature within the thermostatic oven 100 at a constant level.

Assuming that the action is performed at a constant power supply voltage, electric power serving as thermal energy is expressed as V·I. Holding the temperature within the thermostatic oven 100 at a constant level, therefore, is the same as generating electric power proportional to the temperature difference (Tr−Tic) between the set temperature Tr and the measured temperature Tic. That is, a predetermined electric power is consumed to produce the amount of heat, P, represented by the following equation (5):

$$P = B \cdot (Tr - Tic) \quad (5)$$

The relation of the equation (5) is substituted into the equation (3) to obtain the following equation:

$$Tic = B \cdot Mic \cdot (Tr - Tic) + Tout$$

Both sides of this equation are subtracted from the set temperature Tr to obtain the following equation:

$$Tr - Tic = -B \cdot Mic \cdot (Tr - Tic) + Tr - Tout$$

This equation is solved for Tr−Tic to obtain the following equation (6):

$$Tr - Tic = \{1/(1 + Mic \cdot B)\} \cdot (Tr - Tout) \quad (6)$$

By rearranging the equation (6), the following equation (7) is obtained.

$$Tic = -\{1/(1 + Mic \cdot B)\} \cdot (Tr - Tout) + Tr \quad (7)$$

By reference to this equation (7), the difference between the set temperature Tr and the measured temperature Tic of the temperature sensor 2 is proportional to (Tr−Tout) via the proportionality constant $\{1/(1 + Mic \cdot B)\}$.

Figure 5:
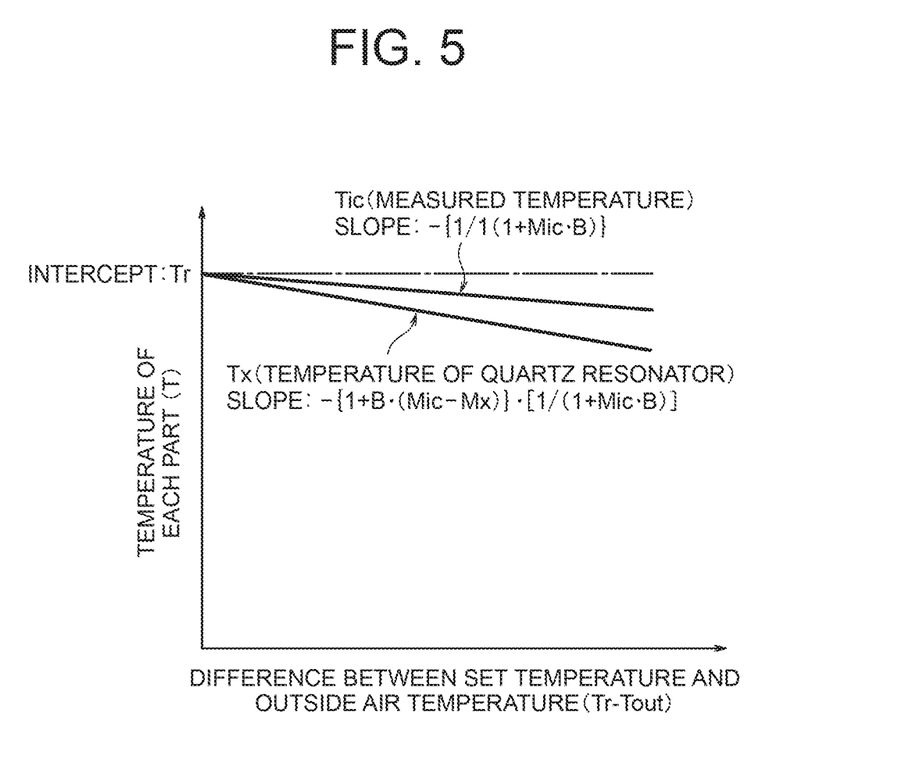
FIG. 5 is a characteristic diagram showing the relation of the temperature of each part to the difference between the set temperature and the outside air temperature in the OCXO according to the conventional technology.

That is, the measured temperature Tic represented by the equation (7) is a linear function of (Tr−Tout) having the set value Tr, which is the constant, as the intercept, and having the slope $-\{1/(1 + Mic \cdot B)\}$, as shown in FIG. 5.

On the other hand, the difference (Tic−Tx) between the measured temperature Tic of the temperature sensor 2 and the temperature Tx of the quartz resonator 3 can be represented by the following equation based on the equations (3) and (4):

$$Tic - Tx = P \cdot (Mic - Mx)$$

The equation (5) is substituted into this equation, and the resulting equation is solved for the temperature Tx to obtain the following equation:

$$Tx = Tic - B \cdot (Mic - Mx) \cdot (Tr - Tic)$$

Further, each side of this equation is subtracted from the set temperature Tr, followed by rearrangement, to obtain the following equation:

$$Tr - Tx = \{1 + B \cdot (Mic - Mx)\} \cdot (Tr - Tic)$$

The equation (6) is further substituted into this equation to obtain the following equation (8):

$$Tr - Tx = \{1 + B \cdot (Mic - Mx)\} \cdot \{1/(1 + Mic \cdot B)\} \cdot (Tr - Tout) \quad (8)$$

By rearranging the equation (8), the following equation (9) is finally obtained:

$$Tx = -\{1 + B \cdot (Mic - Mx)\} \cdot \{1/(1 + Mic \cdot B)\} \cdot (Tr - Tout) + Tr \quad (9)$$

The equation (9) shows that the temperature difference between the set temperature Tr and the temperature Tx of the quartz resonator 3 is also proportional to the temperature difference (Tr−Tout) between the set temperature Tr and the outside air temperature Tout via the proportionality constant $\{1 + B \cdot (Mic - Mx)\} \cdot \{1/(1 + Mic \cdot B)\}$.

That is, the temperature Tx of the quartz resonator 3 represented by the equation (9) is a linear function of (Tr−Tout) having the set value Tr, which is the constant, as the intercept, and having the slope $-\{1 + B \cdot (Mic - Mx)\} \cdot \{1/(1 + Mic \cdot B)\}$, as shown in FIG. 5.

In the case shown in FIG. 5, the slope of the temperature Tx of the quartz resonator 3 is depicted as steeper than the slope of the measured temperature Tic of the temperature sensor 2. However, this magnitude relation changes variously, for example, depending on the layout or design of the components of the OCXO module. It is to be noted that this relation is, no doubt, represented in relation to a linear function.

The module coefficient M and the circuit gain B, mentioned above, actually take only certain finite values. As will be clear by reference to FIG. 5, therefore, since the set temperature Tr is held at a certain fixed value, as in the conventional technologies, the temperature Tx of the quartz resonator 3 cannot be brought to a constant value and, when the difference (Tr−Tout) between the set temperature Tr and the outside air temperature Tout is great, that is, when the outside air temperature Tout is low, the temperature of the quartz resonator 3 lowers without fail. This poses the essential problem that the temperature of the quartz resonator 3 cannot be rendered constant in the conventional OCXO.

<Principle of Present Invention]

As a result of the above-described investigations on the conventional technologies, the conclusion has been reached that since the set temperature Tr is set at the certain fixed value, the temperature Tx of the quartz resonator 3 cannot be brought to a constant value. Also, the finding has been obtained that thermal energy supplied to the heat source 1 is equal to the amount of heat leaking from the heat source 1. In the light of the conclusion and the finding, we have hit on the idea that when the temperature difference (Tr−Tout) between the set temperature Tr and the outside air temperature Tout is great, that is, when the outside air temperature Tout is low, the set temperature Tr, the target temperature of the quartz resonator 3, should itself be rendered variable by the outside air temperature Tout.

Figure 6:
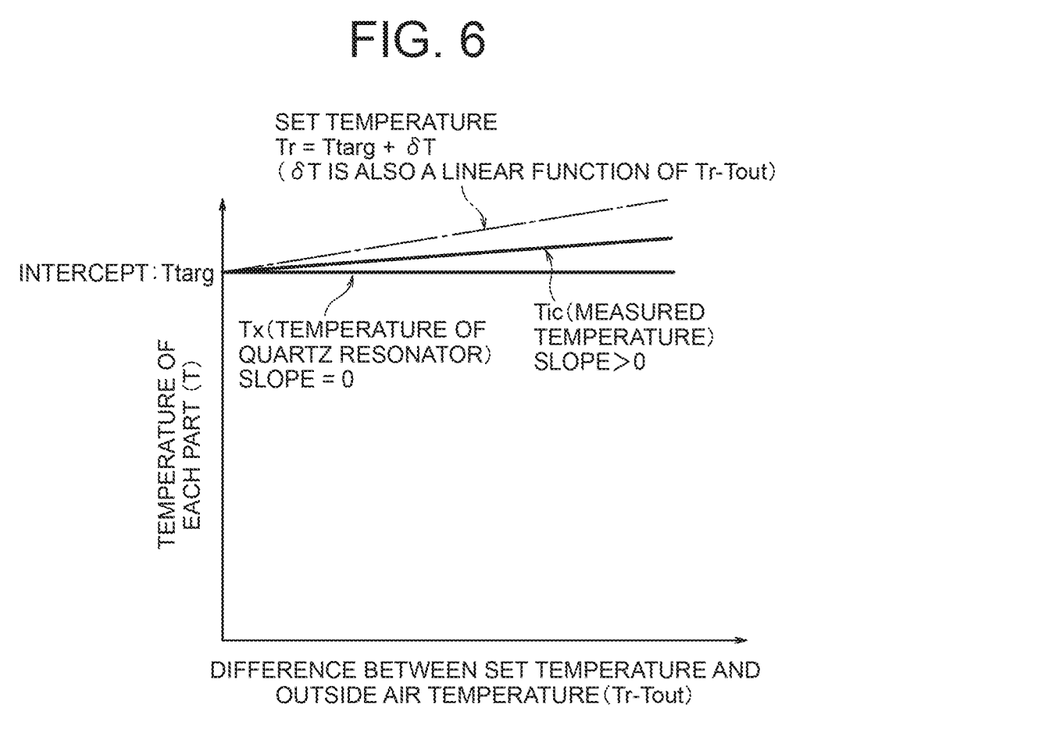
FIG. 6 is a characteristic diagram showing the relation of the temperature of each part to the difference between the set temperature and the outside air temperature in the OCXO according to the present invention.

That is, there is constructed a feedback system which, at a certain outside air temperature Tout, monitors the temperature difference (Tr−Tic) between the set temperature Tr and the measured temperature Tic of the temperature sensor 2; feeds back a feedback amount δT obtained by multiplying the temperature difference (Tr−Tic) by a predetermined feedback coefficient; and adds the feedback amount to a target temperature Ttarg which is the final temperature of the quartz resonator 3 to generate a new set value Tr. By the action of such a feedback system, the temperature Tx of the quartz resonator 3 can be converged to the target temperature Ttarg which is the fixed value set as an initial set value. That is, by changing the set temperature Tr as mentioned above, the temperature Tx of the quartz resonator 3 can be converted into characteristics without a slope, even when the measured temperature Tic which is the circuit temperature of the module based on the outside air temperature, as shown in FIG. 6. That is, even when the temperature difference (Tr−Tout) between the set temperature Tr and the outside air temperature Tout changes, the temperature Tx of the quartz resonator 3 can be held at the target value Ttarg which is a constant value. In short, even when the temperature difference (Tr−Tout) between the set temperature Tr and the outside air temperature Tout changes, the temperature of the quartz resonator 3 can be rendered the target temperature Ttarg, and the oscillation frequency can be held constant with high accuracy.

The present invention based on the above principle is characterized by the following:

1) A thermostatic oven type electronic instrument having a control system for exercising control so that the temperature of a device becomes a target temperature of a predetermined fixed value, the device being housed within a thermostatic oven being a casing which is configured to compare a set temperature and a measured temperature based on an outside air temperature measured by a temperature sensor and which is controlled so that a difference between the measured temperature and the set temperature is narrowed, and the device varying in characteristics according to an environmental temperature, wherein the control system adds a predetermined feedback amount ($\delta T$) to the target temperature (Ttarg) of the fixed value to generate a new set temperature for comparison with the measured temperature so that when the measured temperature lowers, the set temperature becomes high, or when the measured temperature rises, the set temperature becomes low.

2) In 1) above, the control system comprises:

a comparator for comparing a measured temperature signal V_Tic representing the measured temperature with a set temperature signal V_Tr representing the set temperature to deliver a temperature difference signal representing a temperature difference between the measured temperature and the set temperature;

control means for controlling an amount of heat generation by a heat source housed within the thermostatic oven based on the temperature difference signal;

a feedback system having a feedback constant setting unit for generating a feedback amount signal representing the feedback amount based on the temperature difference signal;

an adder for adding a target temperature signal V_Ttarg, which represents the target temperature set in a temperature setting unit, and the feedback amount signal (V_$\delta T$) to generate the set temperature signal V_Tr for inputting, as one of inputs, to the comparator; and the temperature sensor for measuring a temperature based on the outside air temperature and generating the measured temperature signal V_Tic for inputting, as the other input, to the comparator.

3) In 2) above, phase compensation means is provided in the feedback system so that a change in the measured temperature signal V_Tic based on a path of temperature feedback from the heat source to the temperature sensor is followed with a delay by a change in the feedback amount signal (V_$\delta T$) in the feedback system which is a path of electrical feedback.

4) In 2) or 3) above, if thermal resistance between the heat source and an outside of the thermostatic oven is designated as $\theta ho$, thermal resistance between the temperature sensor and the outside of the thermostatic oven is designated as $\theta co$, thermal resistance between the heat source and the temperature sensor is designated as $\theta hc$, and $(\theta ho \cdot \theta co)/(\theta hc+\theta co)$ is defined as a module coefficient Mic, the following relation holds:

$$\{-1<(B \cdot \alpha \cdot Fb)<1\}$$

where B is a gain in an amount of heat with respect to the temperature difference, $\alpha$ is $1/(1+Mic \cdot B)$, and Fb is a gain of the feedback system.

5) In any one of 2) to 4) above, the heat source is formed from a heater, the control means controls a current supplied to the heater, and the feedback amount is generated based on the current supplied to the heater or power consumed by the heater.

6) In any one of 2) to 4) above, the feedback amount is generated based on an output of the comparator directly fed back to the feedback system.

7) In 6) above, clamp means is provided the feedback system so that the feedback amount ($\delta T$)≥0.

8) In any one of 1) to 7) above, the device is a quartz resonator.

Effects of the Invention

In the present invention, a predetermined feedback amount is added to a target temperature, which is of a fixed value, to generate a new set value, and the new set value and the measured temperature are compared to control the temperature within the thermostatic oven so that the temperature difference between the target temperature and the measured temperature is narrowed. By bringing the temperature difference to zero, therefore, the temperature of the device housed within the thermostatic oven can be held constant. As a result, even if the outside air temperature fluctuates, the temperature characteristics of the device can be easily rendered constant, and the stable operation of the device for a long period of time can be ensured. When the device is a quartz resonator, in particular, an oscillation signal of a highly accurate frequency can be generated continuously stably.

DESCRIPTION OF THE INVENTION

Embodiments of the present invention will be described in detail based on the accompanying drawings. In these embodiments, the same parts are assigned the same numerals, and duplicate explanations are omitted.

The respective embodiments shown below are for purposes of illustration only, and are not intended to exclude various modifications and application of technologies which are not explicitly presented in the following embodiments. The features in these embodiments can be modified and executed in ranges which do not deviate from their gist.

Such features, moreover, can be accepted or rejected as required, or can be used in suitable combinations.

First Embodiment

Figure 1:
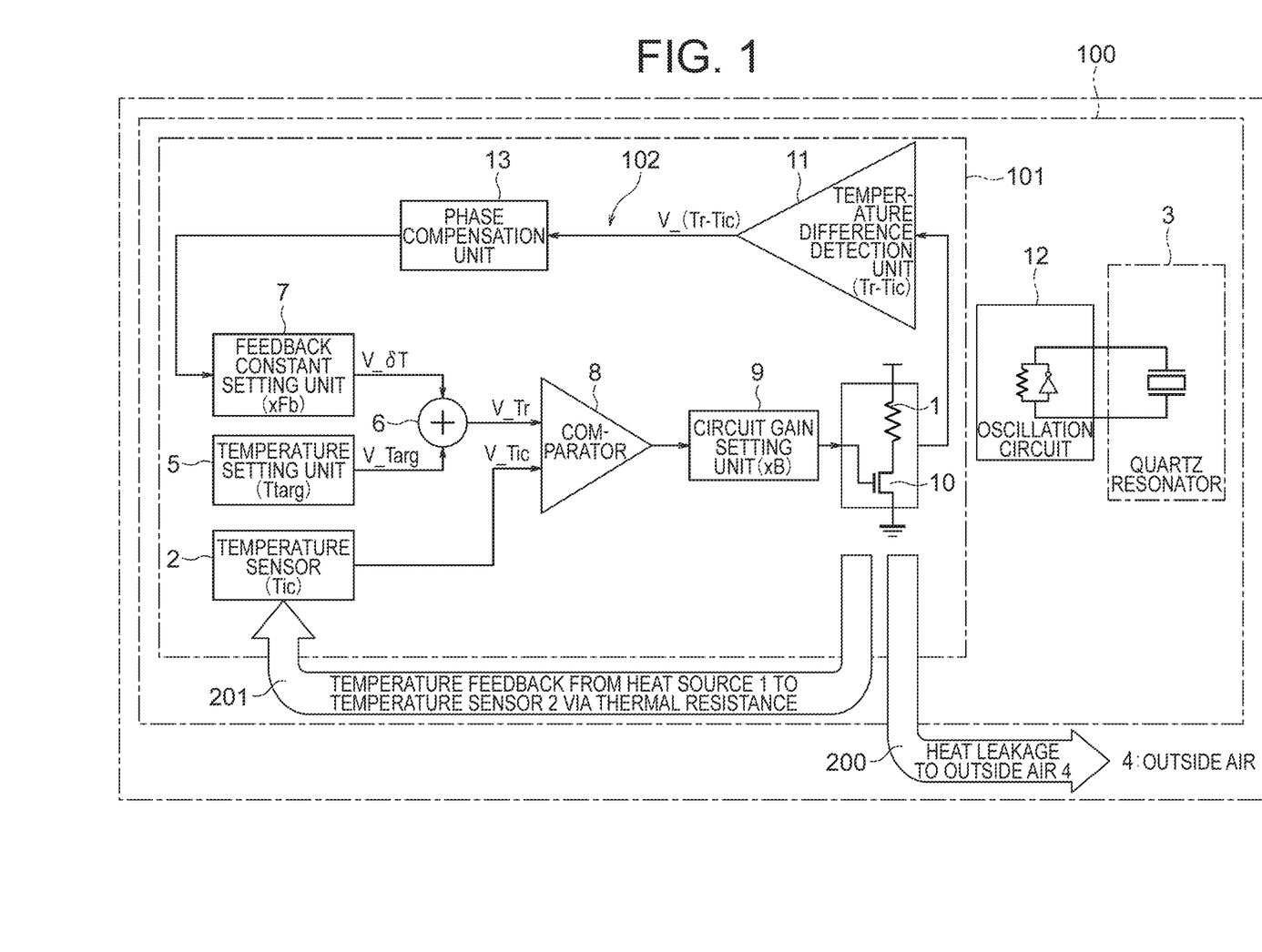
FIG. 1 is a block diagram showing an oven controlled crystal oscillator according to a first embodiment of the present invention.

FIG. 1 is a block diagram showing an oven controlled crystal oscillator (OCXO) according to a first embodiment of the present invention. As shown in the drawing, a quartz resonator 3 to be driven by an oscillation circuit 12 is housed within a thermostatic oven 100, together with a control system 101 for controlling the inside temperature of the thermostatic oven 100 to a constant level. The quartz resonator 3 is a device which is influenced by an outside air temperature (environmental temperature) Tout.

The control system 101 has a comparator 8 compare a measured temperature signal V_Tic, which represents a measured temperature Tic based on the outside air temperature Tout detected by a temperature sensor 2, with a set temperature signal V_Tr representing a set temperature Tr, and controls the amount of heat generation by a heater (heat source) 1 via a transistor (control means) 10 so that a temperature difference signal V_(Tr−Tic) representing the temperature difference (Tr−Tc) between the set temperature and the measured temperature is decreased. In the present embodiment, the control system 101 has an adder 6 add a feedback amount signal V_δT, which represents a predetermined feedback amount δT, to a target temperature signal V_Ttarg representing a target temperature Ttarg so that when the measured temperature Tic lowers, that is, when the outside air temperature Tout lowers, the set temperature Tr becomes high, thereby generating a new set temperature signal V_Tr for comparison with the measured temperature signal V_Tic.

On the other hand, the control system 101 has the adder 6 add a predetermined feedback amount signal V_δT to the target temperature signal V_Ttarg so that when the measured temperature Tic rises, that is, when the outside air temperature Tout rises, the set temperature Tr becomes low, thereby generating a new set temperature signal V_Tr for comparison with the measured temperature signal V_Tic.

The target temperature Ttarg is a targeted temperature within the thermostatic oven 100, that is, a temperature targeted by the quartz resonator 3, and has been set in a temperature setting unit 5 as a fixed value.

The new set temperature signal V_Tr generated by adding the feedback amount signal V_δT to the target temperature signal V_Ttarg serves as one of inputs to the comparator 8. As the other input to the comparator 8, the measured temperature signal V_Tic is supplied. As a result, the comparator 8 outputs a temperature difference signal V_(Tr−Tic) generated by a comparison between the new set temperature signal V_Tr and the measured temperature signal V_Tic.

The temperature difference signal V_(Tr−Tic) is multiplied by a predetermined circuit gain in a circuit gain setting unit 9, and the product is supplied to a gate of the transistor (control means) 10. The circuit gain set in the circuit gain setting unit 9 is intended to convert the temperature, which is the output of the comparator 8, into electric power for consumption in the heater 1 by use of a gain B of a circuit system composed of the comparator 8, the circuit gain setting unit 9, the transistor 10, and the heater 1.

Thus, an electric current conformed to the temperature difference signal V_(Tr−Tic) flows to the heater (heat source) 1 to generate a predetermined amount of heat, heating the interior of the thermostatic oven 100.

A feedback system 102 in the present embodiment is composed of a temperature difference detection unit 11, a phase compensation unit 13, and a feedback constant setting unit 7. The power consumed by the heater 1 can be considered as the amount of heat leaking upon heat leakage 200 from the thermostatic oven 100 to outside air 4. Therefore, the temperature difference detection unit 11 detects the power amount or current consumed to reduce the temperature difference (Tr−Tic), thereby generating the temperature difference signal V_(Tr−Tic) representing the temperature difference (Tr−Tic) for its feedback. The temperature difference signal V_(Tr−Tic) of the feedback system 102 is subjected to predetermined phase compensation (delay processing) in the phase compensation unit 13, and then multiplied by a predetermined feedback constant in the feedback constant setting unit 7, whereafter the product is supplied to the adder 6 as the feedback amount signal V_δT. The feedback coefficient set in the feedback constant setting unit 7 is designed to make an adjustment so that the feedback constant Fb of the feedback system 102 takes on a predetermined value.

The phase compensation unit 13 guarantees the realization of predetermined feedback control in the feedback system 102 by the following functions: A change in the feedback amount signal V_δT in the feedback system 102, which is a path of electrical feedback, is generally faster than a change in the measured temperature signal V_Tic based on a path 201 of temperature feedback from the heater (heat source) 1 to the temperature sensor 2. If this state is unchanged, there is a possibility that the output of the comparator 8, which compares both types of signals and outputs a temperature difference, will oscillate. To avoid such an oscillation phenomenon reliably, the phase compensation unit 13 is provided in the present embodiment so that a change in the measured temperature signal V_Tic based on the path 201 of temperature feedback is followed with a delay by an electrical change in the feedback amount signal V_δT in the feedback system 102. Owing to the predetermined phase compensation in the phase compensation unit 13, the oscillation phenomenon of the output from the comparator 8 can be avoided reliably.

The ordinary OCXO is equipped with the heater 1 for heating purposes, and controls the temperature of the thermostatic oven 100 by relying on the balance between the heating by the heater 1 and natural cooling due to leakage from the thermostatic oven 100 to the outside air 4. That is, an active cooling means such as a cooler is usually not provided. Thus, the outside air temperature Tout becomes very high and, if the measured temperature Tic by the temperature sensor 2 is higher than the set temperature Tr, the present embodiment reduces the current of the heater 1 to zero, and stops heating. Even if the outside air temperature Tout further rises from this time onward, the measured temperature Tic also subsequently rises substantially following the outside air temperature Tout, because a cooler function is absent.

In the present embodiment detecting the outside air temperature Tout by monitoring the current supplied to the heater 1 or the power consumed by the heater 1, the current (power) supplied to the heater 1 is fixed at zero, at a time when Tic>Tr. As a natural consequence, therefore, Tr is fixed at Ttarg. That is, because of no cooling function, the temperature of the entire cooling system 101 cannot be controlled, and inevitably rises simultaneously with the outside air temperature Tout. In the present embodiment, however, once the outside air temperature Tout falls to the target temperature Ttarg or lower, predetermined temperature control over the thermostatic oven 100 is immediately started, and the function of maintaining a constant temperature is restored.

In the OCXO according to the present embodiment described above, the set value Tr as one of the inputs to the comparator 8 is rendered variable based on the feedback amount δT obtained by the feedback system 102. That is, the predetermined feedback amount δT is added by the adder 6 to the target temperature Ttarg of the fixed value to generate a new set value Tr. The new set value Tr and the measured temperature Tic are compared in the comparator 8, and the temperature within the thermostatic oven 100 is controlled so that the temperature difference (Tr−Tic) between them is narrowed. As a result, the temperature difference (Tr−Tic) can be brought to zero, and the temperature of the quartz resonator 3 housed within the thermostatic oven 100 can be kept constant, as shown in FIG. 6. In this manner, even if the outside air temperature 4 varies, the temperature characteristics of the quartz resonator 3 can be rendered constant easily. Consequently, the long-term stable oscillating behavior of the quartz resonator 1 at a constant frequency can be guaranteed.

In order to exhibit the operational advantages of the present embodiment at all times, as stated above, it is necessary for the feedback amount δT of the feedback system 102 not to diverge, but to converge to a constant value. The conditions for such convergence are that the relationship of the following equation holds in the circuit including the feedback system 102:

$$\{-1<(B \cdot \alpha \cdot Fb)<1\}$$

where if thermal resistance between the heater (heat source) 1 and the outside of the thermostatic oven 100 (outside air 4) is designated as θ*ho*, thermal resistance between the temperature sensor 2 and the outside of the thermostatic oven 100 (outside air 4) is designated as θ*co*, and thermal resistance between the heater (heat source) 1 and the temperature sensor 2 is designated as θhc, then (θho·co)/(θhc+θco) is defined as a module coefficient Mic, B is a circuit gain, and α=1/(1+Mic·B).

<Investigation of Convergence Conditions>

The above convergence conditions have been derived from the following investigation:

In the present embodiment, at the certain outside air temperature Tout, the temperature difference (Tr−Tc) between the set temperature Tr and the measured temperature Tic measured by the temperature sensor 2 is detected by the comparator 8, and the temperature difference (Tr−Tc) is multiplied by the predetermined feedback coefficient in the feedback constant setting unit 7 to generate the feedback amount δT. On this occasion, a proportional relationship of the following equation holds from the equation (6):

$$Tr-Tic = \alpha \cdot (Tr-Tout)$$

where α=1/(1+Mic·B)

The amount of heat generated by the heat source 1 is $$P = B \cdot (Tr-Tic)$$

based on the equation (5). Thus, the temperature difference between the set temperature Tr and the measured temperature Tic is actually detectable, for example, from the measured value of the power of the heat source 1.

Hence, the equation (6) is substituted into the equation (5) to rearrange the equation as follows:

$$P = B \cdot \alpha \cdot (Tr-Tout)$$

Then, it is contemplated to repeat the action of the feedback system 102 n times, the action of multiplying certain initial values, P(0), Ttarg, by a certain feedback coefficient, and updating the set temperature Tr as required.

The conditions under which the set temperature Tr does not diverge in the presence of such a feedback action will be explained using a series whose initial value is that in the absence of a feedback action. Assume, here, that the amount of heat generated in the absence of a feedback action is P(0), and the set temperature at this time is Tr=Ttarg. First, an investigation will be conducted on a case in which the feedback action of multiplying this initial value by a certain feedback coefficient, and updating the set temperature Tr as required is repeated n times. Then, a limit with which n reaches infinity will be found.

The target temperature Ttarg has a certain fixed value.

$$P(0) = B \cdot \alpha \cdot (Ttarg - Tout)$$

$$Tr(1) = Ttarg + Fb \cdot P(0)$$

$$\begin{aligned}P(1) &= B \cdot \alpha \cdot (Tr(1) - Tout) \\ &= B \cdot \alpha \cdot (Ttarg + Fb \cdot P(0) - Tout) \\ &= B \cdot \alpha \cdot (Ttarg - Tout) + B \cdot \alpha \cdot Fb \cdot P(0) \\ &= (1 + B \cdot \alpha \cdot Fb) \cdot P(0)\end{aligned}$$

$$\begin{aligned}Tr(2) &= Ttarg + Fb \cdot P(1) \\ &= Ttarg + Fb \cdot (1 + B \cdot \alpha \cdot Fb) \cdot P(0)\end{aligned}$$

$$\begin{aligned}P(2) &= B \cdot \alpha \cdot (Tr(2) - Tout) \\ &= B \cdot \alpha \cdot (Ttarg + Fb \cdot (1 + B \cdot \alpha \cdot Fb) \cdot P(0) - Tout) \\ &= B \cdot \alpha \cdot (Ttarg - Tout) + B \cdot \alpha \cdot Fb \cdot (1 + B \cdot \alpha \cdot Fb) \cdot P(0) \\ &= \{1 + B \cdot \alpha \cdot Fb + (B \cdot \alpha \cdot Fb)^2\} \cdot P(0)\end{aligned}$$

$$\begin{aligned}Tr(3) &= Ttarg + Fb \cdot P(2) \\ &= Ttarg + Fb \cdot \{1 + B \cdot \alpha \cdot Fb + (B \cdot \alpha \cdot Fb)^2\} \cdot P(0)\end{aligned}$$

$$\begin{aligned}P(3) &= B \cdot \alpha \cdot (Tr(3) - Tout) \\ &= B \cdot \alpha \cdot [Ttarg + Fb \cdot \{1 + B \cdot \alpha \cdot Fb + (B \cdot \alpha \cdot Fb)^2\} \cdot P(0) - Tout] \\ &= B \cdot \alpha \cdot (Ttarg - Tout) + B \cdot \alpha \cdot Fb \cdot \\ &\quad \{1 + B \cdot \alpha \cdot Fb + (B \cdot \alpha \cdot Fb)^2\} \cdot P(0) \\ &= \{1 + B \cdot \alpha \cdot Fb + (B \cdot \alpha \cdot Fb)^2 + (B \cdot \alpha \cdot Fb)^3\} \cdot P(0) \dots\end{aligned}$$

$$P(n) = \{1 + B \cdot \alpha \cdot Fb + (B \cdot \alpha \cdot Fb)^2 + (B \cdot \alpha \cdot Fb)^3 + \dots + (B \cdot \alpha \cdot Fb)^n\} \cdot P(0)$$

That is, the heat amount P(n) after repeating the feedback action n times is the initial value P(0) multiplied by a geometric series with the above (B·α·Fb) as a common ratio.

Therefore, the convergence conditions after repeating the feedback infinite times are $$|(B \cdot \alpha \cdot Fb)| < 1$$

where α=1/(1+Mic·B).

Under the above convergence conditions, p(∞) and Tr(∞) expressed as infinite series converge to the following values:

$$p(\infty) = \{1/(1 - B \cdot \alpha \cdot Fb)\} \cdot P(0)$$

$$T(\infty) = Ttarg + \{Fb/(1 - B \cdot \alpha \cdot Fb)\} \cdot P(0)$$

where α=1/(1+Mic·B),
P(0)=B·α·(Ttarg−Tout), and
{Fb/(1−B·α·Fb)}·P(0) is the feedback amount δT.

From the equation (9), moreover, the temperature Tx of the quartz resonator 3 is given by the following equation:

$$Tx(\infty) = -\{1 + B \cdot (Mic - Mx)\} \cdot \{1/(1 + Mic \cdot B)\} \cdot \quad (10)$$

$$(Tr(\infty) - Tout) + Tr(\infty)$$

$$= \{1 + B \cdot (Mic - Mx)\} \cdot \{1/(1 + Mic \cdot B)\} \cdot Tout +$$

$$B \cdot (Mic - Mx) \cdot (1/(1 + Mic \cdot B)) \cdot Tr(\infty)$$

$$= \{1 + B \cdot (Mic - Mx)\} \cdot (1/(1 + Mic \cdot B)) \cdot Tout + B \cdot$$

$$(Mic - Mx) \cdot \{1/(1 + Mic \cdot B)\} \cdot$$

$$[Ttarg + \{Fb/(1 - B \cdot \alpha \cdot Fb)\} \cdot P(0)]$$

$$= \{1 + B \cdot (Mic - Mx)\} \cdot \{1/(1 + Mic \cdot B)\} \cdot Tout + B \cdot$$

$$(Mic - Mx) \cdot \{1/(1 + Mic \cdot B)\} \cdot$$

$$[Ttarg + \{Fb/(1 - B \cdot \alpha \cdot Fb)\} \cdot B \cdot \alpha \cdot (Ttarg - Tout)]$$

$$= \begin{bmatrix} \{1 + B \cdot (Mic - Mx)\} \cdot \{1/(1 + Mic \cdot B)\} - B \cdot (Mic - Mx) \cdot \\ \{1/(1 + Mic \cdot B)\} \cdot \{Fb/(1 - B \cdot \alpha \cdot Fb)\} \cdot B \cdot \alpha \end{bmatrix}.$$

$$Tout + B \cdot (Mic - Mx) \cdot$$

$$\{1/(1 + Mic \cdot B)\} \cdot \{1 + Fb/(1 - B \cdot \alpha \cdot Fb)\} \cdot B \cdot \alpha \cdot Ttarg.$$

The conditions under which the temperature Tx of the quartz resonator 3 becomes constant, irrespective of the outside air temperature Tout, are that the differential coefficient concerned with the outside air temperature Tout in the above equation (10) is zero.

That is, if the circuit gain B and the feedback coefficient Fb are adjusted so that the following equation holds, the temperature Tx of the quartz resonator 3 becomes constant, regardless of the outside air temperature Tout:

$$[\{1+B \cdot (Mic-Mx)\} \cdot \{1/(1+Mic \cdot B)\}-B \cdot (Mic-Mx) \cdot \{1/(1+Mic \cdot B)\} \cdot \{Fb/(1-B \cdot \alpha \cdot Fb)\} \cdot B \cdot \alpha]=0$$

Second Embodiment

Figure 2:
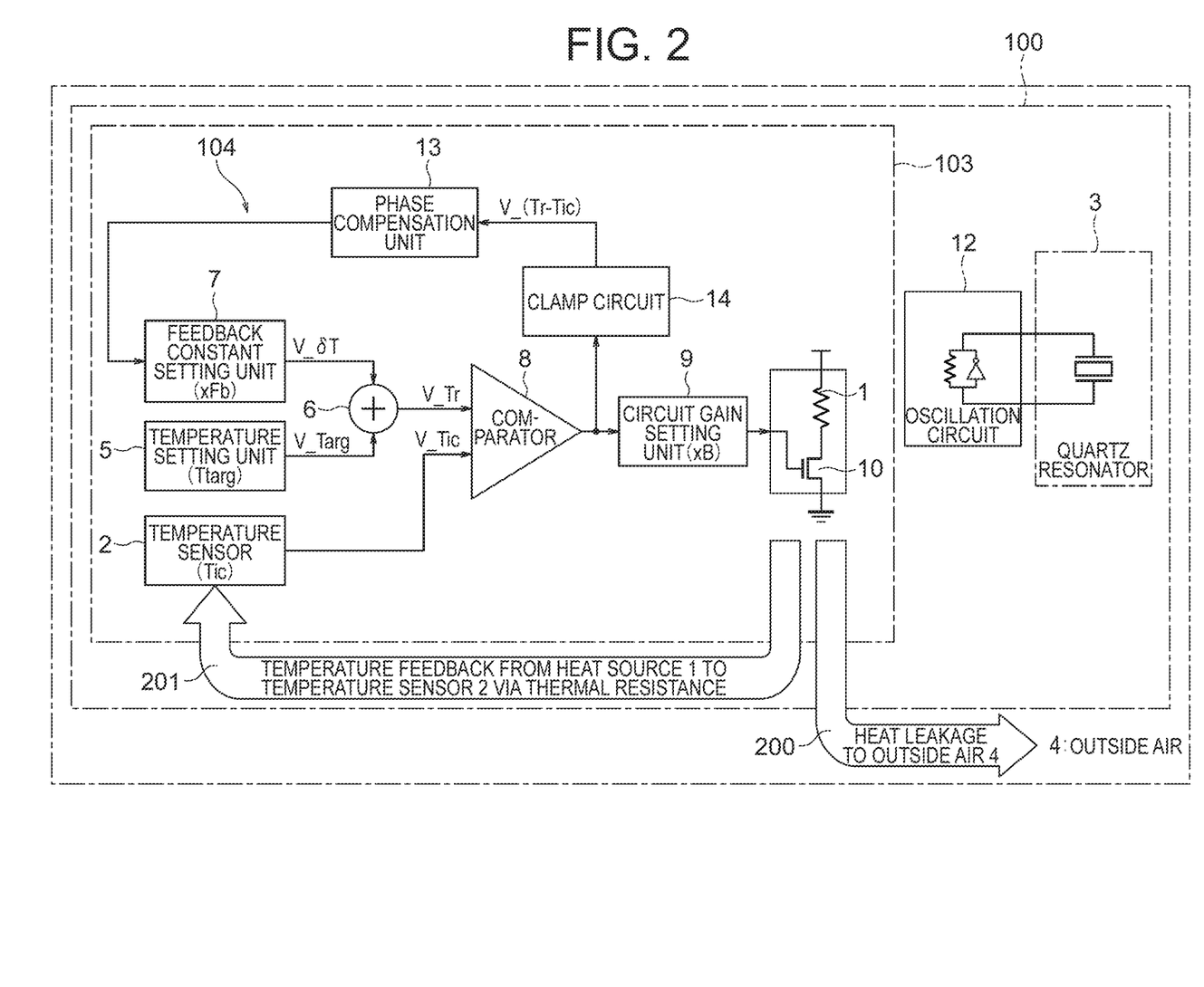
FIG. 2 is a block diagram showing an oven controlled crystal oscillator according to a second embodiment of the present invention.

FIG. 2 is a block diagram showing an oven controlled crystal oscillator according to a second embodiment of the present invention. As shown in the drawing, a feedback system 104 in the present embodiment is configured to directly feed back a temperature difference signal V_(Tr−Tic) which is an output of a comparator 8. That is, a feedback amount signal V_δT is generated based on the output of the comparator 8 directly fed back to the feedback system 104.

The feedback system 104 in the present embodiment is provided with a clamp circuit 14 together with a phase compensation unit 13 having the same function as that in the first embodiment. The clamp circuit 14 is configured to clamp the value of the temperature difference signal V_(Tr−Tic) to zero or higher so that it does not become negative, thereby achieving a feedback amount δT≥0.

In the present embodiment as well, the temperature difference (Tr−Tic) can be reduced to zero, and the temperature of the quartz resonator 3 housed within the thermostatic oven 100 can be held constant (see FIG. 6), as in the first embodiment. In the present embodiment, however, the clamp circuit 14 is needed for the following reasons:

In the first embodiment, even in the absence of a cooler, the current (power) supplied to the heater 1 is fixed at zero at a time when Tic>Tr, with the result that Tr is necessarily fixed at Ttarg. On the other hand, in the control system 103 in which the outside air temperature Tout is detected using the output of the comparator 8 based on the measured temperature Tic by the temperature sensor 2 and the set temperature Tr, as in the present embodiment, the comparator 8 continuously outputs a temperature difference signal V_(Tr−Tic) of a negative value conformed to the temperature difference (Tr−Tic), even when Tic>Tr as a result of a rise in the outside air temperature Tout. Without the clamp circuit 14, therefore, the set value Tr would continue to be controlled to a lower value than the target temperature Ttarg.

Since the OCXO has no cooler function, however, the measured temperature Tic rises following the outside air temperature Tout. In the present embodiment, therefore, the set value Tr is not fixed at the target temperature Ttarg, but set at a very low value.

Once the set temperature Tr is set at the very low value, heating by the heater 1 does not begin until the outside air temperature, even when lowered, reaches the once set very low set temperature Tr. Thus, the problem arises that the undershoot amount of the temperature in the entire system is much larger than when the current (power) supplied to the heater 1 is used for detection of the outside air temperature Tout.

Hence, if the set temperature Tr is controlled with Tr=Ttarg+δT (Ttarg is a fixed initially set value, δT is a feedback amount), an ordinary OCXO having a heater function, but not having an active cooling function, should have a circuit configured so that the feedback amount δT≥0.

Other Embodiments

In the foregoing embodiments, the OCXO has been described as the thermostatic oven type electronic instrument, with the quartz resonator 3 being taken as an example of the device to be influenced by the outside air temperature (environmental temperature) Tout. It goes without saying, however, that the OCXO is not limiting. The present invention can be applied without provision of special limitations, if it is attempted to keep constant the temperature of the device housed within the thermostatic oven 100, that is, if the device varying in characteristics according to the outside air temperature Tout is to be housed. In this case, the characteristics of the device housed can be stabilized.

Other examples of this type of device include a piezoelectric sensor, because the detection accuracy of the piezoelectric sensor depends on the outside air temperature.

EXPLANATIONS OF LETTERS OR NUMERALS

1 Heat source
2 Temperature sensor
3 Quartz resonator
4 Outside air
5 Temperature setting unit
6 Adder
7 Feedback constant setting unit
8 Comparator
10 Transistor
11 Temperature difference detection unit
12 Oscillation circuit
13 Phase compensation unit
14 Clamp circuit
100 Thermostatic oven
101, 103 Control system
102, 104 Feedback system

The invention claimed is:

1. A thermostatic oven type electronic instrument comprising:
 a control system for exercising control so that a temperature of a device to be influenced by an outside air temperature becomes a target temperature of a predetermined fixed value; and a thermostatic oven comprising a casing for housing the device, the control system, and a temperature sensor,
wherein the control system is configured to:
compare a set temperature and a measured temperature, the measured temperature being a temperature measured by the temperature sensor that is a temperature inside the thermostatic oven based on the outside air temperature;
narrow a difference between the measured temperature and the set temperature; and
add a predetermined feedback amount to the target temperature of the predetermined fixed value to generate a new set temperature for comparison with the measured temperature so that when the measured temperature lowers, the set temperature becomes high, or when the measured temperature rises, the set temperature becomes low, and
wherein the device varies in characteristics according to the outside air temperature.

2. The thermostatic oven type electronic instrument according to claim 1, wherein
the control system comprises:
a comparator for comparing a measured temperature signal representing the measured temperature with a set temperature signal representing the set temperature to deliver a temperature difference signal representing a temperature difference between the measured temperature and the set temperature;
control means for controlling an amount of heat generation by a heat source housed within the thermostatic oven based on the temperature difference signal;
a feedback system having a feedback constant setting unit for generating a feedback amount signal representing the feedback amount based on the temperature difference signal;
an adder for adding a target temperature signal, which represents the target temperature set in a temperature setting unit, and the feedback amount signal to generate the set temperature signal for inputting, as one of inputs, to the comparator; and
the temperature sensor for measuring a temperature based on the outside air temperature and generating the measured temperature signal for inputting, as the other input, to the comparator.

3. The thermostatic oven type electronic instrument according to claim 2, wherein
phase compensation means is provided in the feedback system so that a change in the measured temperature signal based on a path of temperature feedback from the heat source to the temperature sensor is followed with a delay by a change in the feedback amount signal in the feedback system which is a path of electrical feedback.

4. The thermostatic oven type electronic instrument according to claim 2, wherein
if thermal resistance between the heat source and an outside of the thermostatic oven is designated as $\theta ho$, thermal resistance between the temperature sensor and the outside of the thermostatic oven is designated as $\theta co$, thermal resistance between the heat source and the temperature sensor is designated as $\theta hc$, and $(\theta ho \cdot \theta co)/(\theta hc+\theta co)$ is defined as a module coefficient Mic, the following relation holds:

$$\{-1<(B \cdot \alpha \cdot Fb)<1\}$$

where B is a gain in an amount of heat with respect to the temperature difference, $\alpha$ is $1/(1+Mic \cdot B)$, and Fb is a gain of the feedback system.

5. The thermostatic oven type electronic instrument according to claim 2, wherein
the heat source is formed from a heater,
the control means controls a current supplied to the heater, and
the feedback amount is generated based on the current supplied to the heater or power consumed by the heater.

6. The thermostatic oven type electronic instrument according to claim 2, wherein
the feedback amount is generated based on an output of the comparator directly fed back to the feedback system.

7. The thermostatic oven type electronic instrument according to claim 6, wherein
clamp means is provided in the feedback system so that the feedback amount $(\delta T) \geq 0$.

8. The thermostatic oven type electronic instrument according to claim 1, wherein
the device is a quartz resonator.

* * * * *